United States Patent [19]

Genovese et al.

[11] Patent Number: 4,859,913
[45] Date of Patent: Aug. 22, 1989

[54] VACUUM FLUORESCENT PRINTING DEVICE

[75] Inventors: Frank C. Genovese, Fairport; James W. Lannom, Webster, both of N.Y.

[73] Assignee: Xerox Corporation, Stamford, Conn.

[21] Appl. No.: 605,728

[22] Filed: May 1, 1984

[51] Int. Cl.⁴ ............................................. H01J 13/56
[52] U.S. Cl. ................................. 315/169.4; 346/160; 430/31
[58] Field of Search ............... 315/169.3, 169.4, 169.3, 315/169.4; 430/31; 346/160

[56] References Cited

U.S. PATENT DOCUMENTS

| | | | |
|---|---|---|---|
| 2,917,385 | 12/1959 | Byrne | 346/160 |
| 3,094,910 | 6/1963 | Van Wagner et al. | 430/31 |
| 3,220,012 | 11/1965 | Schwertz | 430/31 |
| 3,591,802 | 7/1971 | Tajima | 250/486.1 |
| 3,936,645 | 2/1976 | Iversen | 250/486.1 |
| 4,396,928 | 8/1983 | Abe et al. | 346/160 |

*Primary Examiner*—David K. Moore
*Attorney, Agent, or Firm*—William A. Henry, II

[57] ABSTRACT

A vacuum fluorescent printing device is disclosed having cathode filaments, a multiplexed control grid and a skewed matrix of addressable phosphor elements configured on an anode in such a fashion as to enable convenient electrical connection plus imagewise recombination of emitted light from said phosphor elements into a high resolution linear array for the purpose of directing this collection of addressable points of light onto a single line of a photoreceptor drum or belt thereby enabling a xerographic image to be generated.

4 Claims, 3 Drawing Sheets

VACUUM FLUORESCENT PRINTING DEVICE

Reference is hereby made to copending applications, Ser. No. 605,729, now U.S. Pat. No. 4,563,613, entitled "Gated Grid Structure for a Vacuum Fluorescent Printing Device", Ser. No. 605,730, now U.S. Pat. No. 4,558,255, entitled "Edge-Out Matrix Light Bar Coupling Apparatus and Method Using a Fiber Optics Plate", and Ser. No. 605,731, now U.S. Pat. No. 4,578,615, entitled "Vacuum Fluorescent Printing Device Employing a Fly's-Eye Light Coupling Method", filed concurrently herewith and incorported by reference to the extent necessary to practice the present invention.

This invention relates to a printing device for exposing a photosensitive member and, more particularly, to an active light bar which creates precisely controlled marks on a photosensitive member from a digital electronic bit stream that represents a document of which a copy is desired.

Typical medium-to-high quality electronic printing systems have resolutions of 300 pixels (picture elements) per inch or more. Usually the resolution or pixel density is the same in both directions on the page, but this is not necessarily the case for all systems. Each bit of the electronic image is mapped to its appropriate pixel location on a grid that covers the page and defines the resolution of the system. The size of the mark that is made at each location depends on the particular marking process being used and may be smaller, but is usually larger, than the addressability of the system. For example, a round laser dot with a diameter of 1/300 inch may be used for exposure in a system with addressable elements arranged in a square array on 1/400 inch centers. With a raster scanner the information transfer is continuous, a bit at a time within each scan line being supplied, one line after another. However, in principle, the order of mapping pixels is perfectly arbitrary. The choice usually depends wholly on practical considerations.

For an active light bar of a given resolution, the printing speed fixes the maximum time available to make the exposure and the sensitivity of the photosensitive member determines the maximum output power required. For example, if 6 ergs/cm$^2$ is needed for proper exposure of the photosensitive member, a 10 inch width processed at 10 inches per second requires a minimum of 3871 ergs/sec or 0.387 milliwatts delivered to its surface. The process time per pixel mapped one-at-a-time at 300×300 per inch is only 111 nanoseconds.

When the system permits many points to be mapped simultaneously, these stringent time restraints are released. Data processed in parallel can be handled by slower, less expensive logic and circuits in general are much easier to design for low speed applications. The average power output of an individual element is reduced significantly when multiple elements can be used in parallel. The greater the number of sources that contribute to the net output, the greater the total available light and the longer the potential life of an individual element.

Various approaches to xerographic reproduction with cathode ray tubes (CRT) are known as well as vacuum fluorescent display methods of displaying character symbols by the use of anodes.

The following disclosures appear to be relevant:
U.S. Pat. No. 3,641,557
Patentee: Starr
Issued: Feb. 8, 1972

Starr discloses a circuit arrangement for modulating the pattern of voltages appearing on a set of electrodes in an electric discharge tube that displays character symbols on the face thereof.

U.S. Pat. No. 3,780,326
Patentee: Raago
Issued: Dec. 18, 1973

Raago discloses an evacuated envelope having a transparent display face which contains a plurality of selectively energizable, phosphor-coated anode display elements for presenting a symbol display, with an auxiliary electrode disposed either behind or coplanar with said display elements and electrically insulated therefrom. A cathode comprising one or more filaments is situated in front of the display elements.

U.S. Pat. No. 4,004,186
Patentee: Bylander
Issued: Jan. 18, 1977

Bylander discloses a vacuum fluorescent display having a grid plate substantially coplanar with an anode and which is controllable with conventional metal oxide semiconductor devices. Each digit of the display includes a segmented anode structure substantially surrounded by a control electrode or grid plate.

U.S. Pat. No. 4,041,348
Patentee: Eto et al.
Issued: Aug. 9, 1977

In Eto et al. a multi-figure fluorescent display tube is disclosed which includes in a casing a plurality of anode display portions formed of segment electrodes each having a fluorescent material layer thereon, cathodes and control electrodes disposed opposite to the anode display portions, and electrical contacts established through spring action.

U.S. Pat. No. 4,047,072
Patentee: Kishino et al.
Issued: Sept. 6, 1977

Kishino et al. discloses a multi-column fluorescent display tube having a casing composed of a base plate and a cover plate, multi-column pattern display sections each composed of a plurality of segment anodes with fluorescent material layers thereon provided on the upper surface of the base plate, cathodes provided opposite to the pattern displayper made of an insulating material low in thermal conductivity and filament damper supporters.

U.S. Pat. No. 4,134,668
Patentee: Coburn
Issued: Jan. 16, 1979

In Coburn, a combined copying and printing apparatus is disclosed that includes a conventional copying apparatus and a non-impact printer that uses a black on white cathode ray tube optical display to form a latent electrostatic image on the photoreceptor of the copier.

U.S. Pat. No. 4,190,787
Patentee: Kishino et al.
Issued: Feb. 26, 1980

Kishino et al. ('787) discloses a phosphorus luminescent display tube of the triode type having, in a vacuum casing, a filamentary cathode for emitting thermions, a controlled electrode for accelerating and controlling the thermions emitted from the cathode, a plurality of pattern display sections each composed of a plurality of segment anodes each coated with a phosphor layer for emitting light when the thermions impinge thereon, and auxiliary anode conductors provided in the vicinity of and substantially on the same level with the segment anodes.

U.S. Pat. No. 4,270,068
Patentee: Kishino et al.
Issued: May 26, 1981

In Kishino et al. ('068) a fluorescent display device is shown having a filamentary cathode for emitting electrons, pattern display sections each coated with fluorescent material, a plurality of control electrodes electrically independent of one another provided opposite to the pattern display sections respectively, the anodes and control electrodes being selectively given drive signals thereby to make the electrons emitted from the filamentary cathode impinge on the anodes so as to display characters, and a plurality of auxiliary electrodes provided at or above and in the vicinity of gaps between the control electrodes.

U.S. Pat. No. 4,291,341
Patentee: Yajima
Issued: Sept. 22, 1981

Yajima discloses a copying apparatus that employs an electro-optical converter means in the form of an optical fiber tube.

U.S. Pat. No. 4,293,793
Patentee: Kojima et al.
Issued: Oct. 6, 1981

Kojima et al. discloses a fluorescent display tube in which the electron-stream transmission of a grid electrode is controlled by shielding regions of solid or fine mesh form provided in each of the grid meshes in opposing relationship to the exposed insulating portions of an anode substrate lying within the corresponding set of anode segments.

U.S. Pat. No. 4,298,823
Patentee: Kawasaki et al.
Issued: Nov. 3, 1981

Kawasaki et al. discloses a fluorescent display device having a grid which is divided into several pieces electrically separated and disposed in close proximity and in an opposed relationship at the edges thereof. The grids are held in position within the display device by an elongated insulator.

In addition, Ricoh's Japanese Laid-Open Patent Application No. 55-168961/1980 filed under the title "Light Emission Recording Tube" discloses a light tube that is used to transmit light to a photosensitive member. Further in the publication Mini-Micro World/Mini-Micro System of May 1983 on pages 56, 58 and 64 a method of imaging with staggered arrays of recording heads is disclosed. All of the above disclosures are incorporated herein by reference to the extent necessary to practice the present invention.

It has been shown that CRT's can be used in several configurations to generate xerographic images. They can be addressed rapidly and emit sufficient light to expose existing photoreceptors even at relatively high speed and still be gated within the available time. However, they are bulky and expensive, and require complex support circuitry. The dynamics of electron beam deflection makes it difficult to produce light patterns that are bright, very high in resolution, exactly rectilinear, and very stable in location, all at the same time.

The optical image bar of the present invention alleviates the above-mentioned problems and includes a uniquely constructed vacuum fluorescent device that comprises controllable light emitting elements configured in a skewed two dimensional array that expose a photosensitive member in imagewise configuration in accordance with electronic stimulation.

A preferred feature of the present invention is to provide a small, compact and economical electronically addressable optical active light bar for exposing a photosensitive member which includes an anode support substrate on which anode segments are placed in a skewed pattern and covered by fluorescent material. A control grid is placed over the anodes to gate emissions from cathode filaments spaced above the grid. A cover plate having a transparent conductive coating on its inside surface mates with the support substrate to form a hermetically sealed unit. Electrons emitted from the cathode filaments are gated by the grid structure and excite the phosphor-coated anode segments which in turn expose the photosensitive member through an optical coupling means.

Further features and advantages of the invention pertain to the particular apparatus whereby the above-noted aspects of the invention are obtained. Accordingly, the invention will be better understood by reference to the following description, and to the drawings forming a part thereof, which are approximately to scale, wherein.

Figure 1:
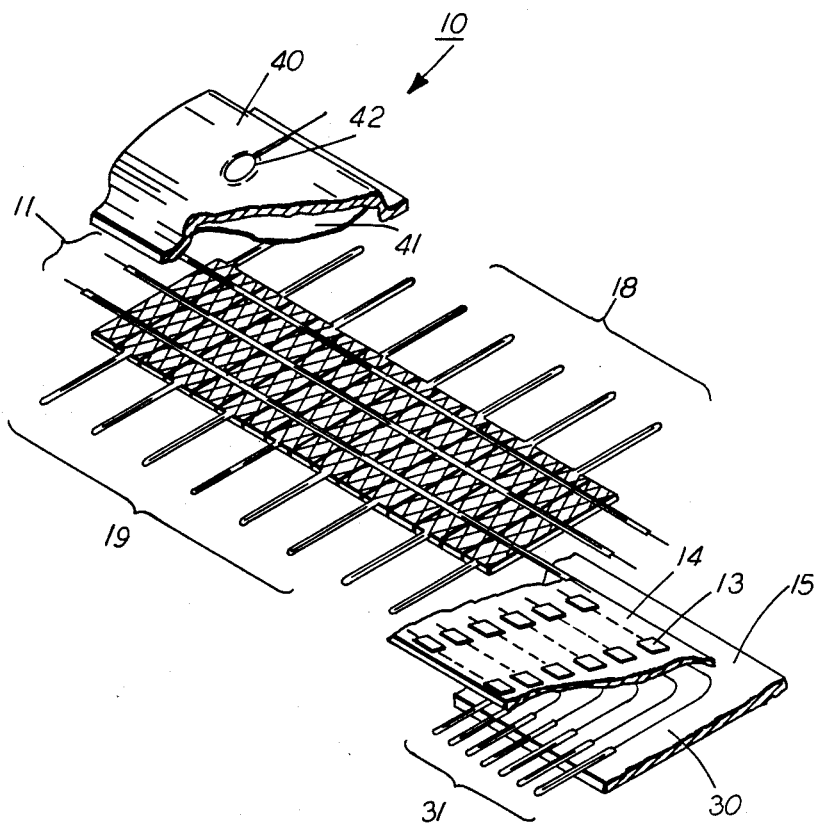
FIG. 1 is a partially exploded isometric plan view of the optical image bar of the present invention.

While the present invention will be described in a preferred embodiment, it will be understood that it is not intended to limit the invention to that embodiment. On the contrary, it is intended to cover all alternatives, modifications and equivalents as may be included within the spirit and scope of the invention as defined by the appended claims.

The device that encompasses the present invention will now be described in detail with reference to the Figures where like reference numerals will be employed throughout to designate identical elements. Although the device for receiving electrical signals and generating an optical output is particularly well adapted for use in a printing machine, it should be evident from the following discussion that it is equally well suited for use in a wide variety of applications and is not necessarily limited to the particular embodiment disclosed.

Referring now to FIG. 1, a vacuum fluorescent device or optical light printing bar 10 is shown with many controllable emitting elements 13 and defining mask 14. The light bar is used as an image generating device in conjunction with a light sensitive recording media, e.g., photographic film, photoresist, photoreceptors, etc., for the purpose of creating electronically generated images on that medium. Within the print bar, electrons emitted from hot filaments 11 are gated by a grid structure 18 to excite phosphor-coated anode elements 13. The anode elements are positioned on an anode support substrate 15 in sixteen distinct rows with lead wires 30 and terminals 31 connected to each row. Above anode elements 13 is grid structure 18 which is divided into 256 separate and distinct columns. Grid terminals 19 are connected to a matrix control for gating purposes. Cathode filaments 11 are positioned to generate electron emission toward the grid structure when energized. A cover plate 40 having a transparent conductive film 41 on its inside surface is attached to anode support substrate 15 in such a manner as to form an air free hermetically sealed unit 10. A high vacuum is maintained through the use of an evaporated "getter" deposit 42. Therefore, the device of the present invention presents 4096 elements in a two dimensional 16×256 matrix addressable array, 16 rows and 256 columns (or any equivalent combination and not necessarily rectangular in shape) to cover a photoreceptor or other photosensitive member width of 10.24 inches with a resolution of 400 pixels per inch. Only 272 signal lines are required for controlling the fluorescent output of 4096 exposing light sources. Connection is made to external line drivers through pads spaced on 100 mil centers along both lengthwise sides of the device which has an envelope approximately 13.6 inches in length. The pads are designed to mate with external edge-connector type hardware.

The optical light bar 10 is matrix controlled according to the truth table shown below and functions as a logical AND gate provided the control voltages $G_m$ and $E_n$ swing widely enough. In the table G is grids 18 and E is elements 13.

| TRUTH TABLE | | |
|---|---|---|
| $G_m$ | $E_n$ | OUTPUT$_{m,n}$* |
| low | low | off |
| low | high | off |
| high | low | off |
| high | high | on |

*for example,
Grids: −10 volts = low; 0 volts = high
Elements: 0 volts = low; +50 volts = high Elements is used herein to mean anode or second grid as disclosed in copending application Ser. No. 605,729 and now U.S. Pat. No. 4,563,613, entitled "Gated Grid Structure For a Vacuum-Fluorescent Printing Device". Cathode gating is also possible but not a preferred embodiment because each filament wire must be electrically independent and shielded.

This strictly logical behavior provides a distinct advantage over other matrix controlled devices, such as liquid crystal displays. In those devices, control is based on the sharp voltage threshold of a physical property of the light modulating or emitting material that is positioned between electrical control elements. The state of the material depends only on the voltage *difference* between the control elements. In the present invention, control is by the electrical activation of two or more juxtaposed electrical control elements where the potential of each with respect to the electron source must be positive. In the present invention, 256 grids $G_m$ are designed to be driven by relatively low voltage TTL logic (up to 30 volts using ordinary open collector chips, or up to 150 volts using special display-driver chips) and are operated at low current levels (grid currents are in the miliampere range). The binary number 256 was chosen because it represents a significant reduction in the number of necessary external interconnections and is a convenient number for the design of the computer controlled drive circuitry. In the grid-anode multiplexing arrangements with the image data presented on the grid columns, the 16 rows of anodes are energized sequentially permitting them to emit light under control of the grids. The imaging data, presented at the 256 grids, control the light output pattern from each anode row in succession. Since there are only 16 rows required in the system, the row drivers can be fabricated from discrete components if necessary, permitting but not necessarily requiring the use of tailored switching circuit designs that can deliver higher voltages and currents than currently available from integrated chips.

Figure 5:
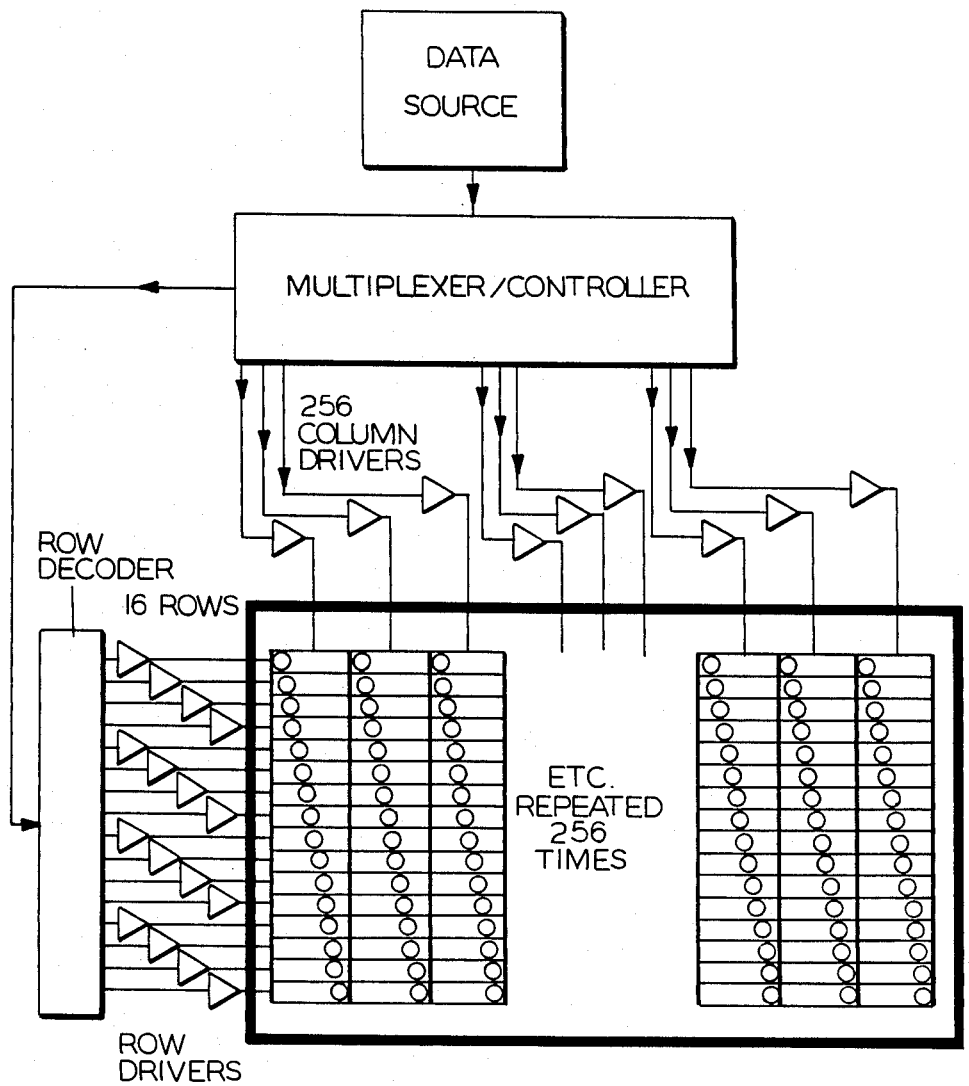
FIG. 5 is an elevational view of a schematic using buffers/drivers and standard logic elements for driving the image bar of the present invention.

An example of known electronics that will drive optical image bar 10 is shown in FIG. 5. A simple schematic is shown that uses conventional buffers and drivers. The multiplexer/controller is fabricated from standard "off the shelf" logic elements. In operation, the data source sends appropriate video data to the controller. The controller then sorts the video data input signals and with the proper timing, sends the correct signals to the column buffer/driver and to the row decoder. The row decoder keeps track of which row is active and signals the row buffer/driver accordingly.

Figure 2:
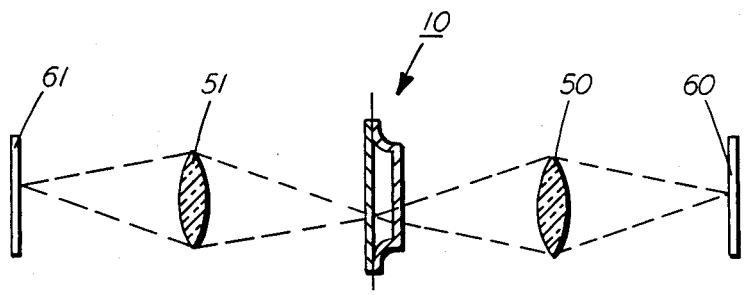
FIG. 2 is an elevational view of a partial schematic showing an alternative embodiment of the present invention that utilizes light emitted from either the front or back of an image bar.
Figure 3:
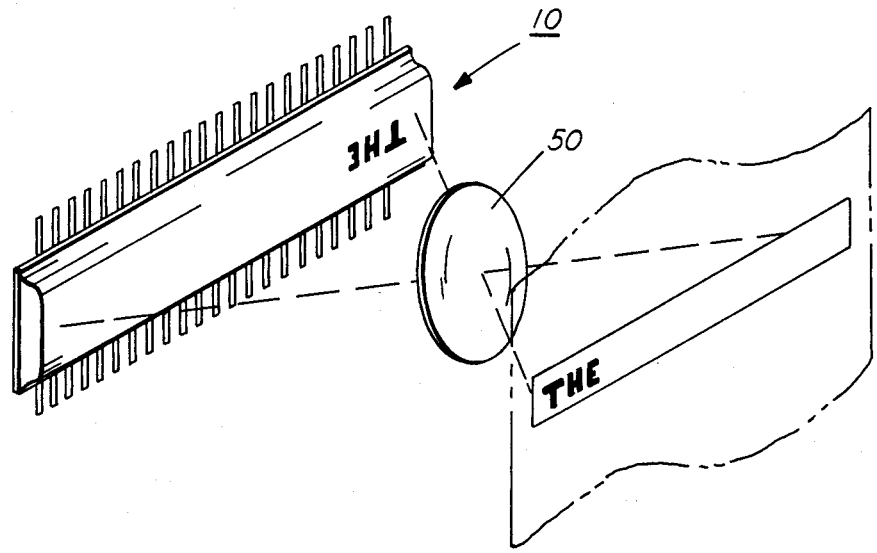
FIG. 3 is an isometrical schematic view of the image bar of the present invention shown projecting an image.

A vacuum fluorescent device containing a large number of electronically controllable light sources in some fixed pattern is not by itself sufficient to make a high resolution print bar device. In conventional vacuum fluorescent tubes, practical considerations limit the closest physical spacing of segments to approximately 15–20 mils. With this limitation, placing all 4096 segments of print bar 10 in a single line spaced at about 400 to the inch is precluded. However, as a solution, if the segments are arranged in a rectangular array spaced 40 mils apart in both the X and Y directions (forming an active area of 0.60 inches in width and 10.24 inches in length) and by inclining the array by 40 mils with respect to the direction of photoreceptor motion, the minimum spacing requirements for the anodes as well as the grids and terminals are easily accomplished. Guiding the light output from each segment to its proper location on photoreceptor 60 or 61 as shown in FIGS. 2 and 3 is by the use of a conventional 1:1 lens or optical coupling means 50 or 51. With this type of optical coupling means, anodes 13 are masked internally by an opaque layer 14 to precisely define the active light output region, and skewed slightly so that they are displaced a proper amount when imaged on the photoreceptor. This arrangement lends itself to simplified control by a relatively course overlying grid structure because the active elements are spaced far apart. For the same image size and resolution at the photoreceptor, magnifications through the optical coupling means 50 or 51 that are greater than 1 require higher pixel density in the display while magnifications less than 1 require an oversize display. As shown in FIG. 2, light emitted from either the front or back of print bar 10 can be used. The only change required to utilize light emitted from the back of the structure of print bar 10 would be to make anode support substrate 15 and anodes 13 transparent, and relocate mask 14.

Figure 4:
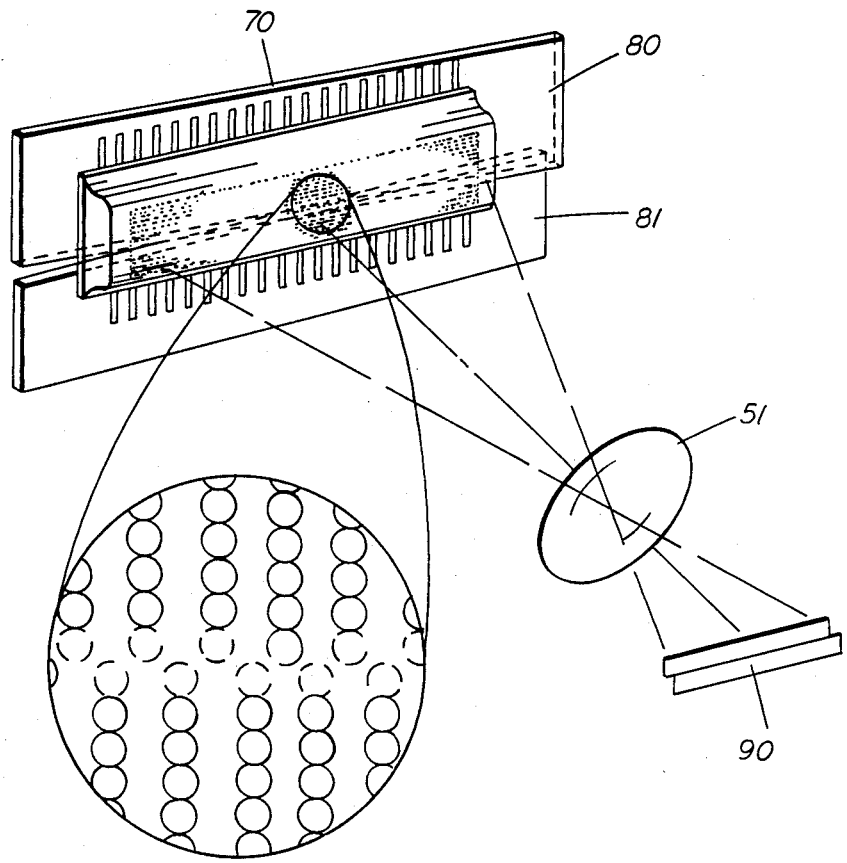
FIG. 4 is a partial schematic of an alternative optical system using a rectilinear display type image bar.

As an alternative, for a limited format application such as the making of postal or shipping labels from electronic mailing lists, an oversize display is acceptable and the simpliest approach is to project a reduced image of the display on the photoreceptor. As shown in FIG. 4, a rectangular image can be skewed optically by inserting prisms or plain glass plates, oriented at a small angle, between the optical coupling means 50 and the front of a rectilinear vacuum fluorescent device 70. By this means, rectilinear displays can be used to generate interlaced images at densities higher than the intrinsic pitch of the display.

FIG. 4 shows a rectilinear vacuum fluorescent tube having a 26×256 segment array with an active area 6.56 inches long and 0.66 inches high. This is projected on the photoreceptor at 0.61X magnification to form an image 4 inches long shown as 90. Two glass plates 80 and 81 are shown that skew the top and bottom halves of the display 70 to the right and left respectively by ¼th the pitch of the display segments; the two images then appear to be offset by half the segment spacing. Two plates are used so that the object-optical coupling means distance of both halves are identical.

In operation, data representing every other pixel is presented to the top portion of the display; the missing in-between pixels are exposed by the lower portion of the display. They are generated by the same columns in the display but appear interlaced in the completed image, doubling the effective display pitch. This technique can be arbitrarily extended to additional stages of optical skewing up to the number of rows by the use of additional glass plates or by a single multi-faceted equivalent prism.

Returning to the embodiment of the present invention shown in FIG. 3 as a means of coupling light from optical bar 10 to a photosensitive member, anode members 13 are skewed slightly and masked to precisely define the active light output region. By doing so, the output of each segment is mapped to a particular spot on the photoreceptor in a pattern that covers all possible locations as the photoreceptor progresses. Light from the element in the first row and Nth column is imaged 1/16 of 40 mils=1/400 inches to one side of light from the element in the 16th row and N-1th column. In this fashion, a continuous row of 2.5 mil wide pixels are imaged adjacent to each other on the photoreceptor. Computer generated data is presented so that the appropriate pixel locations are exposed at the proper time. In this arrangement, different portions of the photoreceptor over a 0.60" by 10.24" area are in the process of being exposed at any moment rather than all elements in one line at the same time. This skewed matrix technique is applicable to any extended array of individually controlled light sources, such as, light emitting diodes or electroluminescent elements.

In conclusion, an optical print bar is disclosed that receives electronically generated signals from a computer or other digital output sources and converts them into an illuminated mosaic that exposes a photosensitive member in imagewise configuration. The print bar includes wire filaments, a multiplexed control grid and a skewed matrix of addressable phosphor coated anode elements mounted on a support substrate. The phosphor coated elements are excited by electrons emitted from the filaments through the control grid and the light is directed to the surface of a photosensitive member to expose it for subsequent processing. Alternatively, the print bar could also be constructed having an anode covering a support substrate with excitable phosphors placed on the anode covering at discrete locations.

What is claimed is:

1. A printing system, comprising in combination:
a light sensitive recording media;
an optical coupling means; and
a compact vacuum fluorescent active light bar enclosed in a hermetically sealed housing having a glass cover plate with a transparent conductive coating inside the cover plate and adapted for communication with said light sensitive recording media through said optical coupling means in order to create images from electronically generated data on said light sensitive recording media, said light bar having a plurality of cathode filaments, a control structure, and a matrix of addressable fluorescent substance coated anode elements mounted on a support substrate such that as said elements are excited by electrons from said cathode filaments through said control grid structure a high resolution array of precisely defined light is generated and directed toward said light sensitive recording media, and wherein said fluorescent substance coated anode elements are arranged in a skewed matrix so that they are displaced a proper amount when imaged on said recording media.

2. The printing system of claim 1, wherein said fluorescent substance is an electroluminescent phosphor.

3. The printing system of claim 2, wherein said phosphor coated anode elements are masked by an opaque layer in order to precisely define the light output region.

4. The printing system of claim 3, wherein said light bar has front and back surfaces and light is emitted from said phosphor substance through both of said front and back surfaces in order to simultaneously expose two light sensitive members.

* * * * *